United States Patent
Hertz et al.

(10) Patent No.: US 6,662,812 B1
(45) Date of Patent: Dec. 16, 2003

(54) METHOD FOR ACOUSTIC AND VIBRATIONAL ENERGY FOR ASSISTED DRYING OF SOLDER STENCILS AND ELECTRONIC MODULES

(76) Inventors: Allen David Hertz, 12784 Tulipwood Cir., Boca Raton, FL (US) 33428; Eric L. Hertz, 12784 Tulipwood Cir., Boca Raton, FL (US) 33428; Dennis D. Epp, 24 Grandbriar, Aliso Viejo, CA (US) 92656

( * ) Notice: Subject to any disclaimer, the term of this patent is extended or adjusted under 35 U.S.C. 154(b) by 129 days.

(21) Appl. No.: 09/621,249

(22) Filed: Jul. 21, 2000

Related U.S. Application Data (63) Continuation of application No. 60/145,524, filed on Jul. 24, 1999.

(51) Int. Cl.[7] .................................................. B08B 3/10
(52) U.S. Cl. ......................... 134/1.3; 134/25.4; 34/279
(58) Field of Search .................... 134/1, 1.3, 32, 134/25.4; 34/279

(56) References Cited

U.S. PATENT DOCUMENTS

| | | | |
|---|---|---|---|
| 3,592,395 A | | 7/1971 | Lockwood et al. |
| 3,694,926 A | * | 10/1972 | Rodwin et al. |
| 3,750,306 A | * | 8/1973 | Rodwin et al. |
| 4,318,749 A | * | 3/1982 | Mayer ........................ 134/25.4 |
| 4,333,246 A | * | 6/1982 | Sullivan et al. |
| 4,334,366 A | * | 6/1982 | Lockwood |
| 4,523,389 A | * | 6/1985 | Diggle, Jr. et al. |
| 4,805,318 A | * | 2/1989 | Bramlette et al. ............. 34/279 |
| 4,929,975 A | * | 5/1990 | Shidara |
| 5,105,557 A | * | 4/1992 | Vadasz et al. |
| 5,113,882 A | | 5/1992 | Gileta |
| 5,114,494 A | * | 5/1992 | Remec .......................... 134/1 |
| 5,368,649 A | * | 11/1994 | Tsukazaki |
| 5,601,655 A | * | 2/1997 | Bok et al. ...................... 134/1 |
| 5,671,547 A | * | 9/1997 | Truchet et al. |
| 5,888,308 A | * | 3/1999 | Sachdev et al. ............... 134/1 |
| 5,911,232 A | * | 6/1999 | Mokuo et al. ............... 134/1.3 |
| 5,938,856 A | * | 8/1999 | Sachdev et al. ............. 134/1.3 |
| 6,085,437 A | * | 7/2000 | Stipp |
| 6,119,367 A | * | 9/2000 | Kamikawa et al. |
| 6,143,087 A | * | 11/2000 | Walter .......................... 134/1 |
| 6,230,420 B1 | * | 5/2001 | Lawrenson et al. ........... 34/164 |
| 6,273,100 B1 | * | 8/2001 | Andreas et al. .............. 134/1.3 |
| 6,286,231 B1 | * | 9/2001 | Bergman et al. ............. 134/1.3 |
| 6,334,902 B1 | * | 1/2002 | Mertens et al. ................. 134/1 |

FOREIGN PATENT DOCUMENTS

| WO | WO 91/01473 | * | 7/1990 |
|---|---|---|---|

* cited by examiner

*Primary Examiner*—Frankie L. Stinson
(74) *Attorney, Agent, or Firm*—Allen D. Hertz (57) ABSTRACT

A method and apparatus are disclosed for improving drying of a module, tooling, and solder stencils via the introduction of acoustic pressure waves and/or vibrational energy to the module, tooling, or solder stencils. The acoustic pressure waves may be created by a transducer where the waves are transferred to the module through air or a vibrational interface medium. The acoustic pressure waves impinge on the water droplets to atomize the droplets on the surface of the module and in the cracks, crevices and hard to reach areas of connectors and other components, without undesirable heat. The acoustic energy may further be used to assist in cleaning solder stencils within an automated screen printer.

19 Claims, 7 Drawing Sheets

METHOD FOR ACOUSTIC AND VIBRATIONAL ENERGY FOR ASSISTED DRYING OF SOLDER STENCILS AND ELECTRONIC MODULES

This patent application claims priority to Provisional Patent Application No. 60/145,524 filed Jul. 24, 1999.

Field of the Invention

This invention relates in general to the field of drying systems, and in particular to a method and apparatus for acoustic and vibrational energy assisted cleaning and drying of electronic modules and solder stencils.

BACKGROUND OF THE INVENTION

Hot air drying systems are an established method of drying bare Printed Circuit Boards (PCB's), various components on a (PCB), and tooling which may require cleaning such as stencils, board supports, and the like. There are a wide variety of equipment and processes available to manufacture, solder, clean and dry PCBs, and to clean and dry stencils and other tooling, however, the general principles of the process remain the same, as explained below.

After components have been assembled to the PCB, the assembly is often referred to as a module. Flux residue and other contaminants may remain on the module after assembly, necessitating the cleaning and drying process. These residues may be similar to those found on stencils and other tooling required for the assembly process. The module, stencil or other tooling may be cleaned in an aqueous cleaning system used to remove flux residue or other contaminates such as solder balls associated with the component or module manufacturing process. Once cleaned, it is important to remove all of the moisture from the interior of open components on the module and the exterior of the module. It is also necessary to remove moisture from stencils or other tooling required in the process.

The limitations of this process continue to be challenged with the inclusion of smaller openings within connectors, smaller gaps under components, and the like which can entrap moisture. Any excess water or moisture will cause corrosion over time. This is especially a problem when power is applied to a module which is not dry, causing a galvanic reaction and, therefore, corrosion.

Tooling, such as solder stencils and wave solder pallets, require cleaning after becoming contaminated with either solder paste or flux residue. Solder stencils need to have any remaining solder paste removed prior to storage. If the solder paste dries within the apertures of the stencil, the dried solder paste will interfere with the release of the solder paste during the next assembly process and cause defects. Build up of flux residue on wave solder pallets will hinder the application of the flux onto the assembly and cause defects.

The solder stencil printing process sometimes includes an under wiping process. The under wiping process may further apply a solvent to either the under wiping paper or the underside of the stencil. The under wiping process can further include a vacuum system which removes the loose solder particles located inside the apertures of the stencil and any solvent in the direct flow of the vacuum. The under wiping process may not sufficiently remove excess solvent remaining on the top-side of the stencil. The process may not remove all of the solder residue within the apertures of the stencil.

After completion of the reflow and/or wave soldering processes, the assemblies are cleaned to remove the remaining residue or contaminants. The cleaning process applies some form of liquid, generally water. Chemicals with relatively low flash points were used in the past, but those chemicals are expensive and some were found to be harmful to the environment. One of the more desirable chemicals used to clean assemblies is water. Water, or other cleaning solutions with similar flash points, are difficult to dry in a short time period. The desirable outcome of the drying process is for components and the module to be sufficiently dried to preclude corrosion. Various processes and devices are available to dry electronic modules.

In one case, hot air is blown over and across the module with sufficient velocity, volume and thermal content to evaporate some of the moisture and urge some of the remaining moisture off the module. The limitations of this are that the dryers require a great deal of thermal energy and large capacity air blowers to provide sufficient drying. Additionally, these dryers are generally loud and require sound dampening. Drying depends on convection of hot gases past the module. The rate of drying decreases after a portion of moisture has been removed. The last few points of moisture removal take the longest and increase the cost of drying. If one attempts to increase the temperature of the drying gas, there is a risk of thermally damaging the electronic components on the module. The efficiency of drying is proportional to the temperature of the drying gas. Thermally damaging the module sets a practical upper limit for the gas temperature. Additionally, this process continues to be limited when moisture is trapped in components such as connectors.

In another case, infrared energy is applied to the module in an attempt to evaporate excess moisture. This process is somewhat limited by the time required for drying excess moisture. Because of this limitation, infrared dryers are often used in conjunction with hot air dryers. Infrared energy transfers heat to the exposed surfaces; where the infrared energy would have a difficult time to evaporate entrapped moisture from within pockets of components such as connectors or under components designed to have a space between them and the surface of the PCB, such as ball grid array packages.

In another case, reference is made to U.S. Pat. No. 4,334,366 which teaches a method of drying objects in a perforated drum. Hot gas and sonic energy are used to dry the food objects which are tumbled in the perforated drum, and upon sufficient drying, the objects are removed from the drum. The limitations of this patent are that electronic modules cannot be tumbled in a drum and are most often processed on a conveyor to preclude damage to the module.

In yet another case, reference is made to U.S. Pat. No. 3,592,395 filed Sep. 16, 1968, to Lockwood et. al. This dryer uses pulsating hot gas and sonic energy to dry a stirred slurry. This dryer readily handles slurries or other fine powdery materials. This type of dryer would not work with electronic modules as any stirring of electronic modules would cause mechanical damage to the modules.

In yet another case, reference is made to U.S. Pat. No. 5,113,882 filed Aug. 28, 1990 to Gileta. A dryer system for a liquid cleaning apparatus has a dehumidifier to remove vapors, droplets of liquid cleaning agent and recirculate dry gas onto workpieces moving on a conveyor. Gileta teaches lowering the relative humidity within the atmosphere to increase the efficiency of the drying of printed circuit assemblies.

Ultrasonic transducers are used in wave soldering technology to atomize liquid flux into a fine mist and transferring the flux in mist form from the source reservoir to the bottom side and into the plated through holes of the module. This is commonly referred to as a spray fluxer. This clearly shows that moisture can be atomized when near or contacting a source of vibrational energy.

It can be recognized that improvements made to the drying process of modules, can also be utilized in the drying processes applied to tooling as well as stencils within solder printers and stencils in stencil cleaners.

While each of these improvements has contributed to the art, the limitations of these processes continue to be challenged.

Thus, what is desirable, is a means to reliably clean and dry electronic modules and tooling utilizing a minimal amount of energy and time and precluding any mechanical or thermal damage to the module.

SUMMARY OF THE INVENTION

The present invention addresses the deficiencies in the art by applying acoustic pressure waves and vibrational energy proximate to the surface of the module or tooling such that the energy aids in the improvement of drying of electronic modules. The contacting and/or non-contacting pulsating energy increases the drying efficiency over the prior art solutions by atomizing moisture droplets into a fine mist, as well as allowing the combined use of prior art solutions such as hot air blowers and infrared energy. The deficiencies within the present art may further be addressed by including the same vibrational energy in conjunction with the cleaning fluid during the cleaning process to further aid in cleaning the object.

One aspect of the current invention is to provide a means to apply acoustic pressure waves to the desirable side of a module causing the atomizing of excess moisture.

A second aspect of the present invention is the use of ultrasonic sources for the acoustic pressure waves.

A third aspect of the present invention is to provide a means to use acoustic pressure waves to atomize moisture in small openings, crevices and hard to reach places.

A fourth, aspect of the invention is to combine at least one of acoustic pressure waves and vibrational energy to prior art solutions such as hot air knives allowing improved efficiency and lower time and energy costs.

A fifth aspect of the present invention is the ability to dry tooling such as wave solder pallets or solder stencils.

A sixth aspect of the present invention is the inclusion of a vibrational energy source within an under stencil cleaner within an automated or semi-automated solder paste printing apparatus.

A seventh aspect of the present invention is the inclusion of a vibrational energy source in conjunction with a fluid to aid in the cleaning process.

An eighth aspect of the present invention is the inclusion of a vibrational energy source in conjunction with the cleaning process of an under stencil wiper.

A ninth aspect of the present invention is the inclusion of a vibrational energy source to atomize residual moisture on stencils.

A tenth aspect of the present invention is the inclusion of a vibrational energy source to atomize residual moisture on stencils, used in conjunction with an under stencil cleaner.

An eleventh aspect of the present invention is the combination of using the vibrational energy source for both cleaning and drying.

A twelfth aspect of the present invention is the inclusion of a vibrational transfer medium placed between the vibrational energy source and the object.

A thirteenth aspect of the present invention is the use of air to transfer the vibrational energy to the object.

A fourteenth aspect of the present invention is the use of at least one of ultrasonic transducer, speaker, tuning fork, horn, and sonar transducer to generate the vibrational energy.

A fifteenth aspect of the present invention is the application of the disclosed technology within an automated in-line cleaner.

A sixteenth aspect of the present invention is the application of the disclosed technology within an automated stencil cleaner.

A seventeenth aspect of the present invention is the application of the disclosed technology within an automated solder printer.

An eighteenth aspect of the present invention is a means for changing the relational proximity of the vibrational energy source and the at least one of electronic assemblies and tooling related to manufacture of electronic assemblies to one another. One example would be a conveyor. A second would be a means for moving the vibrational energy source.

The present invention comprises an apparatus used to apply acoustic pressure waves and resulting vibrational energy to a module to atomize moisture during the drying phase of assembly of the module. The apparatus preferably includes equipment known in the art: a conveyor to move the module through an in-line cleaner wash, rinse, and drying sections, which can include hot air blowers and infrared heaters. Alternatively, the present invention may be included within other equipment known in the art such as stencil cleaners and batch cleaners or solder printers.

The present invention discloses the application of acoustic pressure waves and resulting vibrational energy to atomize excess moisture and entrapped moisture in hard to reach cracks and crevices, thus overcoming the surface tensional forces and allowing increased efficiency of the hot air dryers and the infrared heaters. The acoustic pressure waves, generated by a transducer and transferred to the module through the air, will impinge the module at the angle proscribed and not be substantially affected by the volume or velocity of the hot air flow caused by the hot air dryers.

The present inventions further discloses the application of vibrational energy through close proximity to dry preferably planar tooling such as stencils where heat is not desirable.

DETAILED DESCRIPTION OF THE INVENTION

Figure 1:
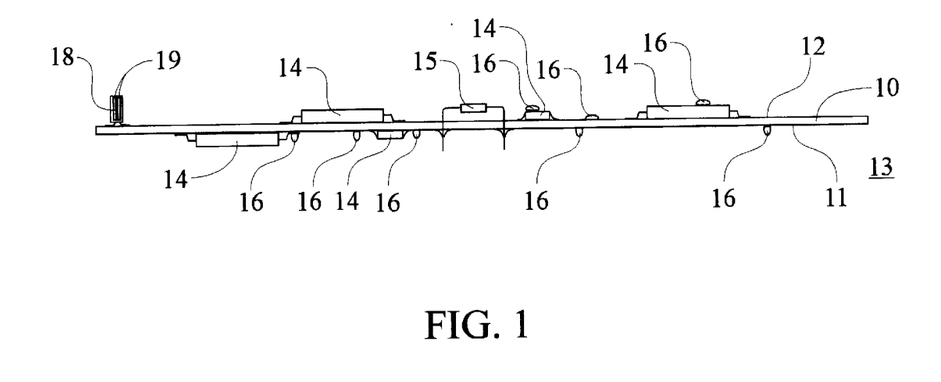
FIG. 1 is a sectional side elevation illustrating a module with water droplets on the top surface and bottom surface.

FIG. 1 illustrates a sectional side elevation of a module 13. The module 13 consists of a Printed Circuit Board (PCB) 10 which has two 2 sides; a solder side 11 and a component side 12. Electromechanically attached to the illustrated PCB 10 are surface mount components 14, a leaded component 15, and a connector 18. An assembly with a PCB 10, surface mount components 14, a leaded component 15, and a connector 18 is collectively referred to as a module 13. After the module 13 is washed, moisture droplets 16 may be found on the solder side 11 and the component side 12 of the module 13. Surface tension may cause the moisture droplets 16 to adhere to the module 13 increasing the difficulty of drying. Additionally, moisture droplets 16 may become entrapped in the cavities 19 within the connector 18, or under components such as Quad Flat Packs (QFPS's), Thin Small Outline Packages (TSOP's), Ball Grid Arrays (BGA's), Micro Ball Grid Arrays (uBGA's) and the like, further increasing the difficulty of drying, as forced air and infrared heating can not accelerate the evaporation of moisture within the cavities 19.

Figure 2:
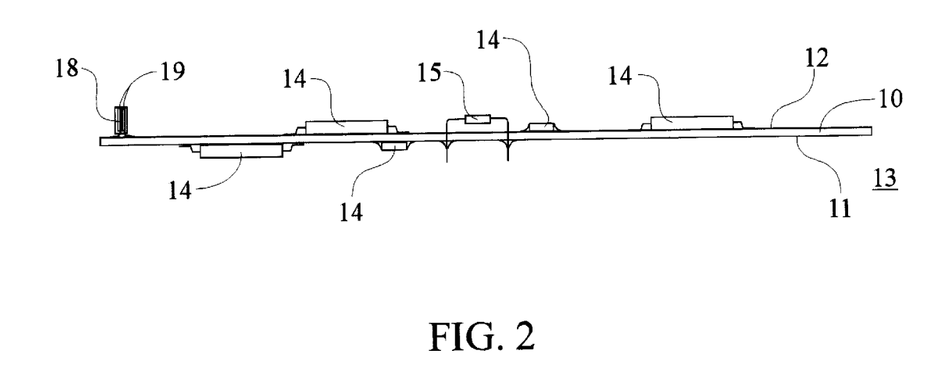
FIG. 2 is a sectional side elevation illustrating a module where the water droplets have been removed.

FIG. 2 illustrates a module 13 in the desirable state, which has been through the drying process. All of the moisture droplets 16 which were previously shown in FIG. 1 have been removed by the drying process. Additionally, moisture droplets 16 entrapped in the connector 18 and under components have also been removed.

Figure 3:
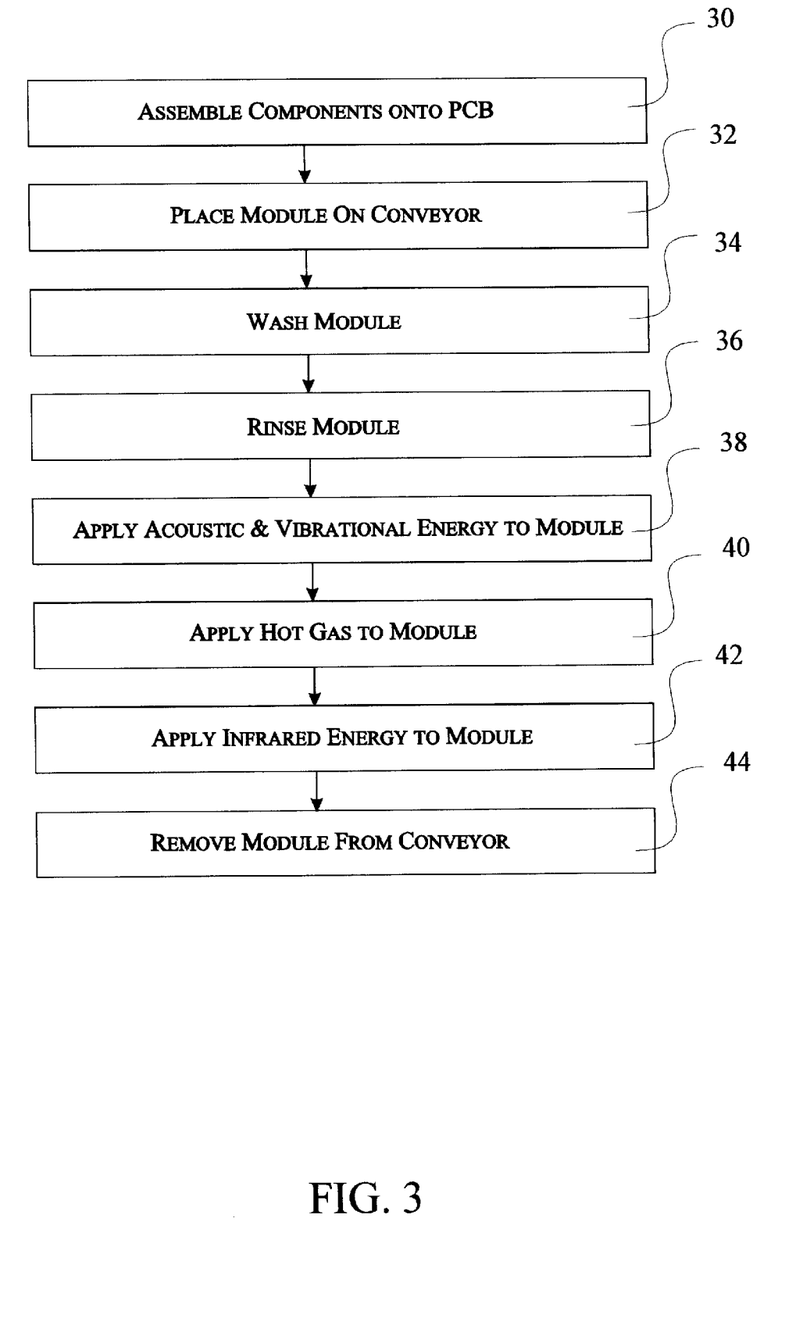
FIG. 3 is a flow diagram which illustrates the general assembly and cleaning process in conjunction with the present invention.

FIG. 3 is a flowchart which illustrates the assembly and drying process. The process begins with the first step 30 where surface mount components 14 and leaded components 15 are assembled onto a PCB 10. This can be accomplished using any of the known technology. During the second step 32, the module 13 is placed on a conveyor (not shown) of an automated cleaning apparatus (not shown). During the third step 34, the module 13 is washed. During the fourth step 36 the module 13 is rinsed. During the fifth step 38, vibrational energy 50 in the form of pressure waves (shown in FIG. 4) is directed towards to the module 13. During the sixth step 40, hot gas 54 (shown in FIG. 4) can be applied to the module 13. During the seventh step, 42 infrared energy (not shown) can applied to the module 13. It can be recognized that the sixth step 40 and the seventh step 42 can be used independently, or any other technology currently known to assist in drying a module 13. It can also be recognized that the use of vibrational energy 50 can be applied in simultaneously with any other known drying apparatuses. During the final step 44, the module 13 is removed from the conveyor of the automated cleaning apparatus (not shown).

Figure 4:
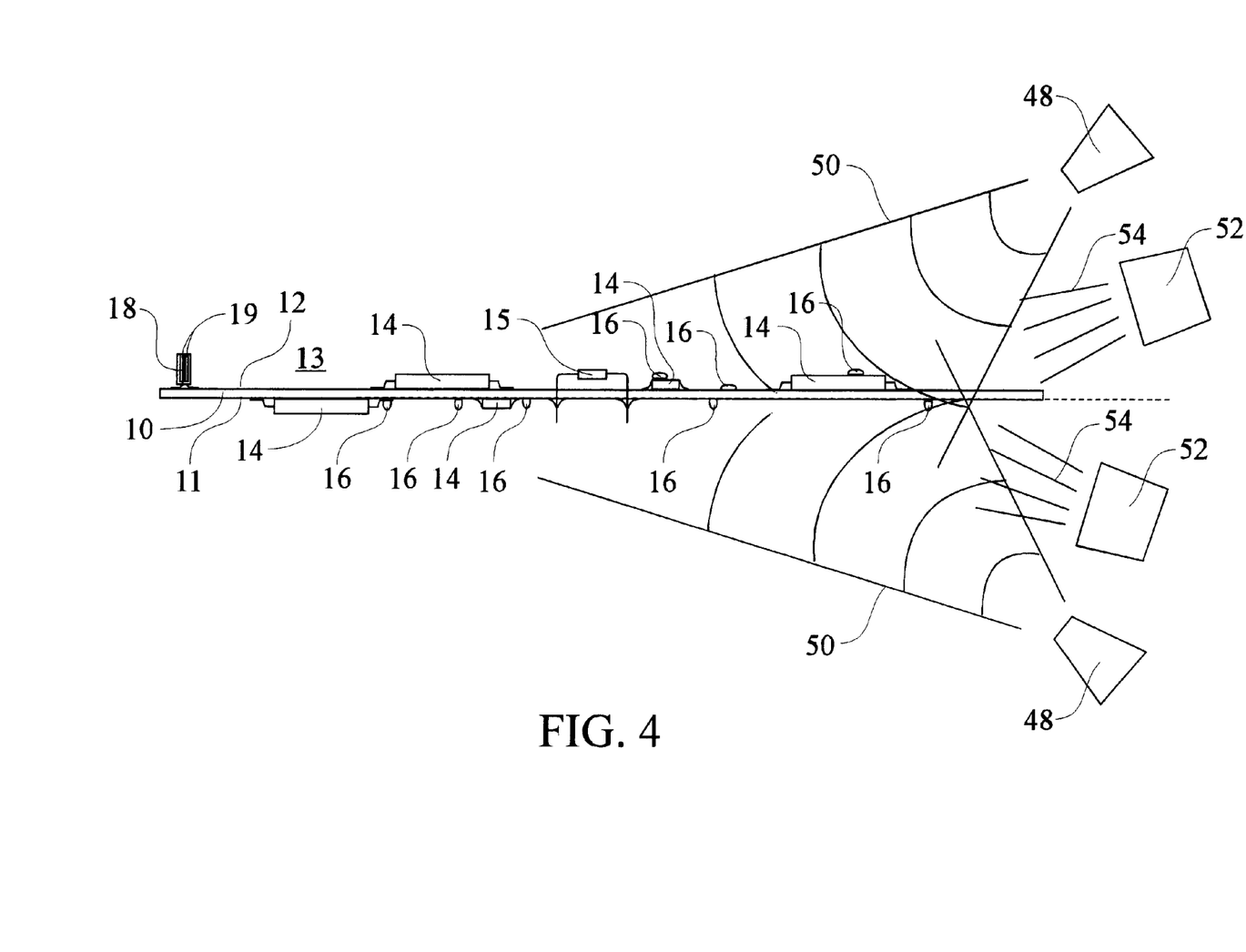
FIG. 4 is a sectional side elevation of a module being dried utilizing acoustic pressure waves and hot gas.

FIG. 4 illustrates a module 13 traveling on a path 46 from left to right, the path representative of a conveyor. The module 13 has moisture droplets 16 on the component side 12, the solder side 11 and entrapped in the connector 18. At least transducer 48 emits vibrational energy 50 in the form of pressure wave which impinge the module 13 and the moisture droplets 16 at a predetermined angle. The vibrational energy 50 atomizes the moisture droplets 16 on the component side 12, on the solder side 11, in the cavities 19 of the connector 18, and under components 14. By atomizing the moisture droplets 16, the process reduces the gathered volume per droplet and increases the surface area per droplet. These two changes increase the rate of evaporation.

A second drying means can be used to further dry the module 13. The figure illustrates a hot gas 54, preferably hot air, can be emitted from a hot air nozzle 52 which is directed at the module 13 in a predetermined angle. The hot air 54 evaporates the atomized moisture droplets 16 and removes them from the module 13. The module 13 may then be treated with infrared energy to complete the drying process. Other methods can include forced air using turbines, infrared heating, convection heating, and the like.

Figure 5:
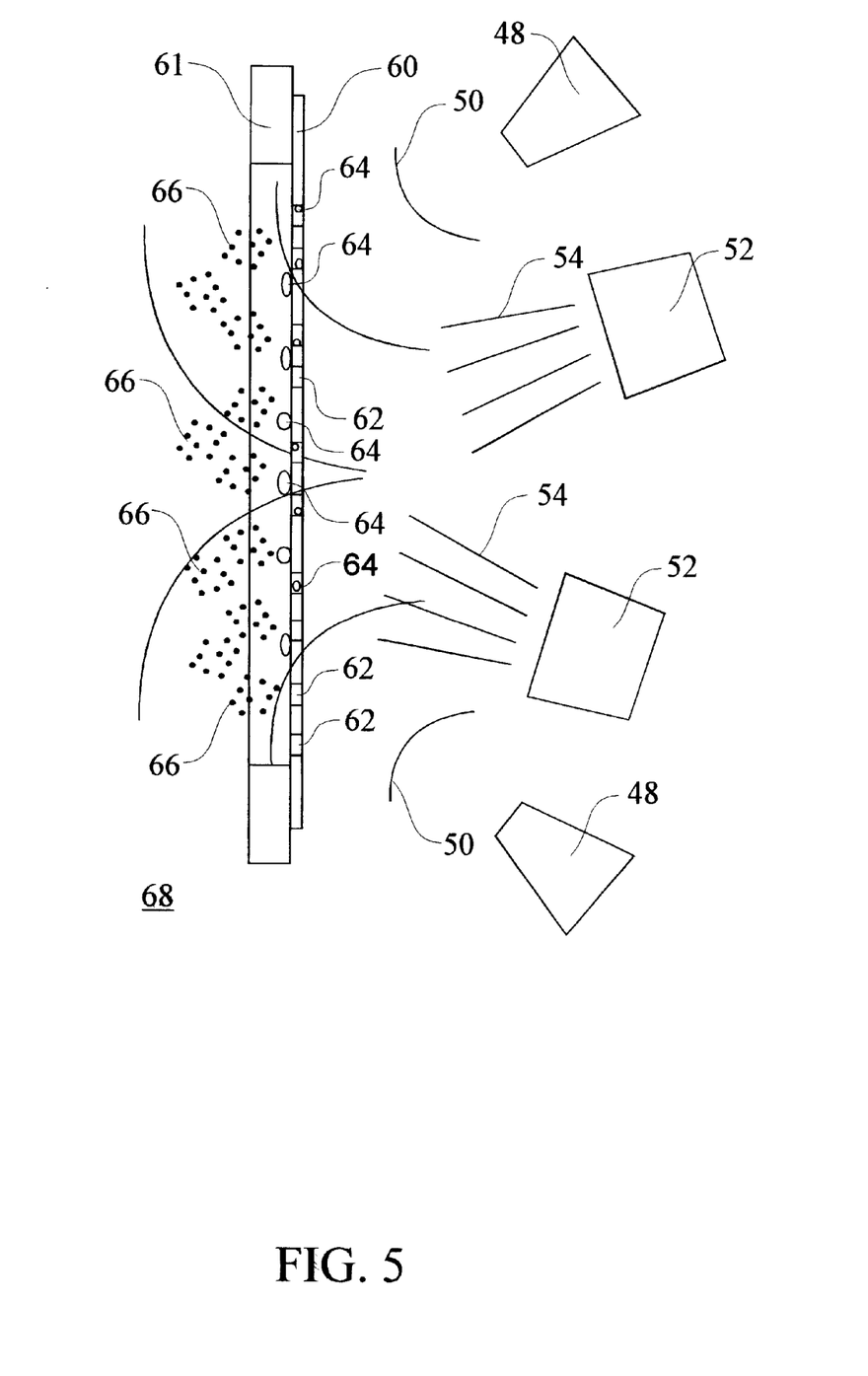
FIG. 5 is a sectional side view of a stencil cleaner in the drying cycle in conjunction with the use of ultrasonic transducers.

FIG. 5 illustrates an embodiment utilized to assist in the drying process used during the cleaning of tooling such as stencils and wave solder pallets. A stencil 60 is mounted within a stencil frame 61. The stencil 60 includes apertures 62 which are used to transfer a pattern of solder paste to the PCB during the assembly process. Upon completion, the solder paste must be removed from the stencil and from within the apertures 62. The optimal process to remove the solder paste from the apertures 62 of the stencil is to utilize a stencil cleaner 68. A cleaning fluid is applied to the stencil 60 to remove the remaining solder paste. The cleaning fluid leaves moisture droplets 16 on the surfaces of the stencil 60 and within the apertures 62. At least one transducer 48 emits vibrational energy 50 shown in the form of pressure waves which impinge the stencil 60 and the moisture droplets 16 at a predetermined angle. The acoustic and vibrational energy 50 turn the moisture droplets 16 on the stencil 60 and in the apertures 62 into atomized moisture droplets 66 on the stencil and suspended in the air. By atomizing the moisture droplets 16, the process reduces the gathered volume per droplet 16 and increases the surface area per droplet 16. These two changes increase the rate of evaporation. Other drying methods can be employed as described for FIG. 4. One can recognize this apparatus may be used for drying other objects such as bare PCB's, batch cleaning of assembled modules 13, or tooling such as wave solder pallets and squeegee blades. It can be recognized that the hot air nozzle 52 and the at least one transducer 48 may be on a varying angle or on a moving carriage (not shown) to increase the drying efficiency.

Figure 6:
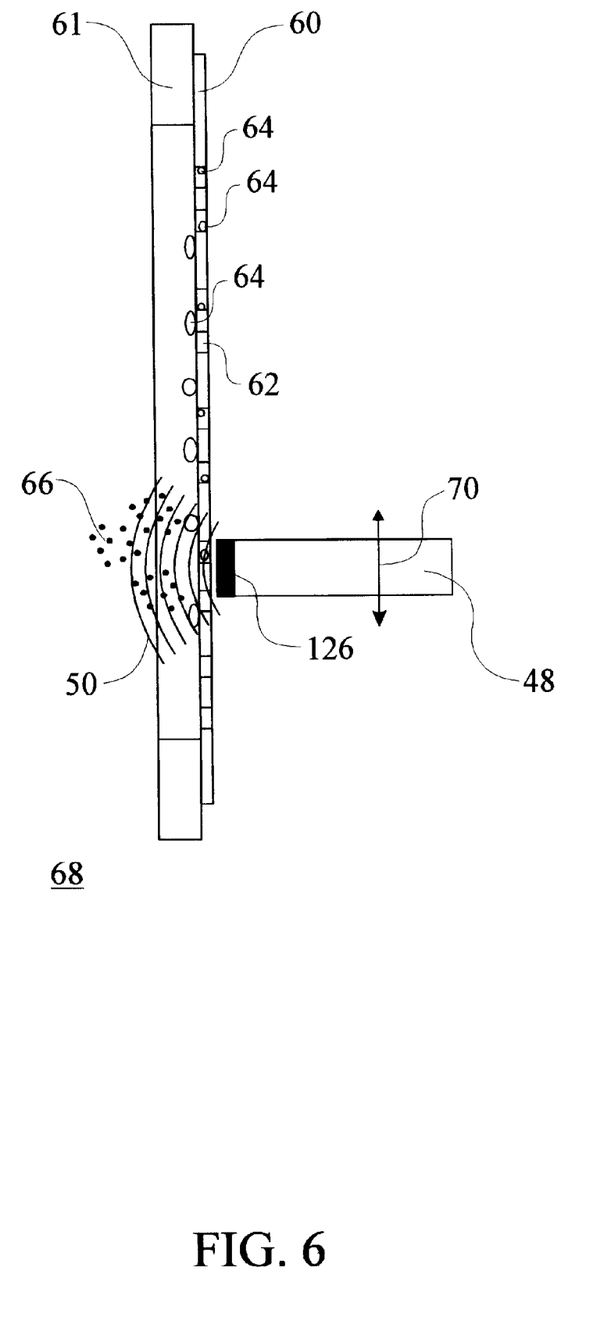
FIG. 6 is a sectional side view of a solder stencil cleaning apparatus using vibrational energy for cleaning and drying.

FIG. 6 illustrates a cross sectional view of a stencil cleaner 68 using vibrational energy 50 in close proximity to or contacting the stencil. Illustrated is an transducer 48 such as an ultrasonic horn located proximate the stencil 60, whereby the transducer 48 passes across 70 the stencil 60. A vibrational interface medium 126 can be coupled to the transducer 48 to place a thermal barrier between the transducer 48 and stencil 60 to reduce heat transfer, while mechanically transferring vibrational energy 50. The vibrational energy 50 can be used in conjunction with fluids to aid in removing solder paste residue (not shown) from the stencil 60 and apertures 62. The same vibrational source 48 can be used for both cleaning assistance and drying.

Figure 7:
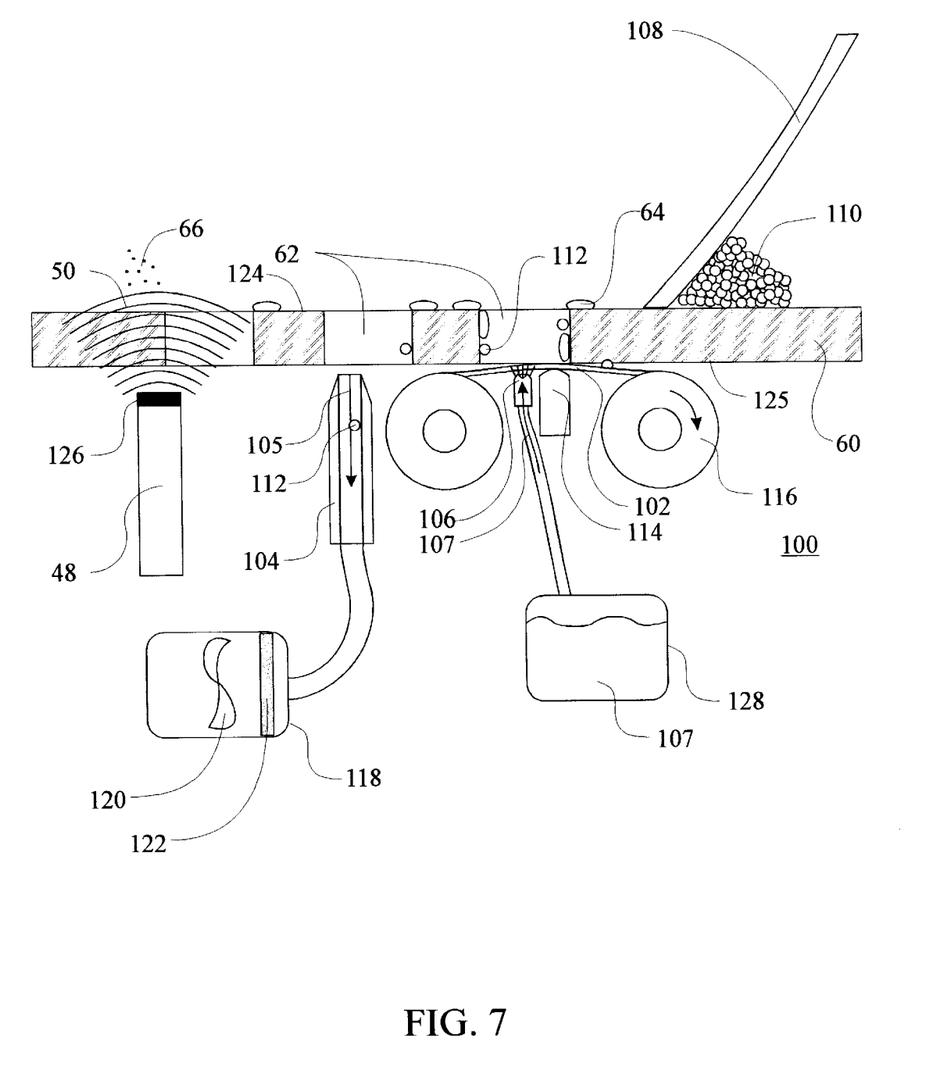
FIG. 7 is a sectional side view of a solder stencil in conjunction with an under wiping system with the use of an ultrasonic transducer for drying.

FIG. 7 illustrates a cross sectional view of a solder stencil 60 and under wiping system 100 in conjunction with a preferred embodiment of the present invention. The system described would normally be found within a semi-automated or automated solder screen printer (not shown), but it can be recognized that it may be applied to other system devices. The solder screen printer includes a stencil 60 and a squeegee 108, where the squeegee 108 passes a material such as solder paste 100 across a plurality of stencil apertures 62. The stencil 60 would separate from the object, such as a printed circuit board (PCB) (not shown) depositing most of the material, such as solder paste 110 onto the object. Solder paste residue 112 sometimes remains within the stencil apertures 62 or along the bottom (contact) side of the stencil 125. Under wipe systems such as the one described with solvent 107, wiper paper 102, and vacuum 105 are already known. The solvent dispenser 106 applies a solvent 107 from a solvent reservoir 128 generally to the under wiping paper 102. The under wiping paper 102 is transferred between the two under wiper paper handling rollers 116 and pressed against the bottom (contact) side 125 of the stencil 60 by an under wiper paper support 114. The solvent 107 soaked under wiping paper 102 passes across the stencil 60 removing the undesirable residual solder paste 112 from the bottom (contact) side 125 of the stencil 60. The wiping process leaves resident moisture (solvent) 64 inside the stencil apertures 62 and on the top (squeegee) side 124 of the stencil 60. A vacuum system 118 is introduced to remove solder paste residue 112 and resident moisture 64 from inside the stencil apertures 62. The vacuum system 118 includes a vacuum fan 120 which provides a vacuum force 105 to a vacuum nozzle 104. The vacuum nozzle 104 and vacuum force 105 collects the solder paste residue 112 and resident moisture 64 from inside the stencil apertures 62 and transfers it to a collection filter 122. The vacuum system 118 may not remove resident moisture 64 from the top (squeegee) side 124 of the stencil 60. An ultrasonic transducer 48 applies acoustic and vibrational energy 50 to the stencil 60, preferably without contacting the stencil 60. This may be accomplished by providing an air gap or a vibrational interface medium 126 between the transducer 48 and the stencil 60. The vibrational energy 50 causes the resident moisture 64 to atomize into atomized moisture 66 and lift off the top (squeegee) side 124 of the stencil 60. The preferred embodiment would be to incorporate all features into one apparatus. It may also be recognized that the transducer 48 may be incorporated within the vacuum nozzle 104. It can be recognized that other under wiping and/or under wiping vacuum systems exist or may be developed which should not limit the spirit or intent of the present invention.

Figure 8:
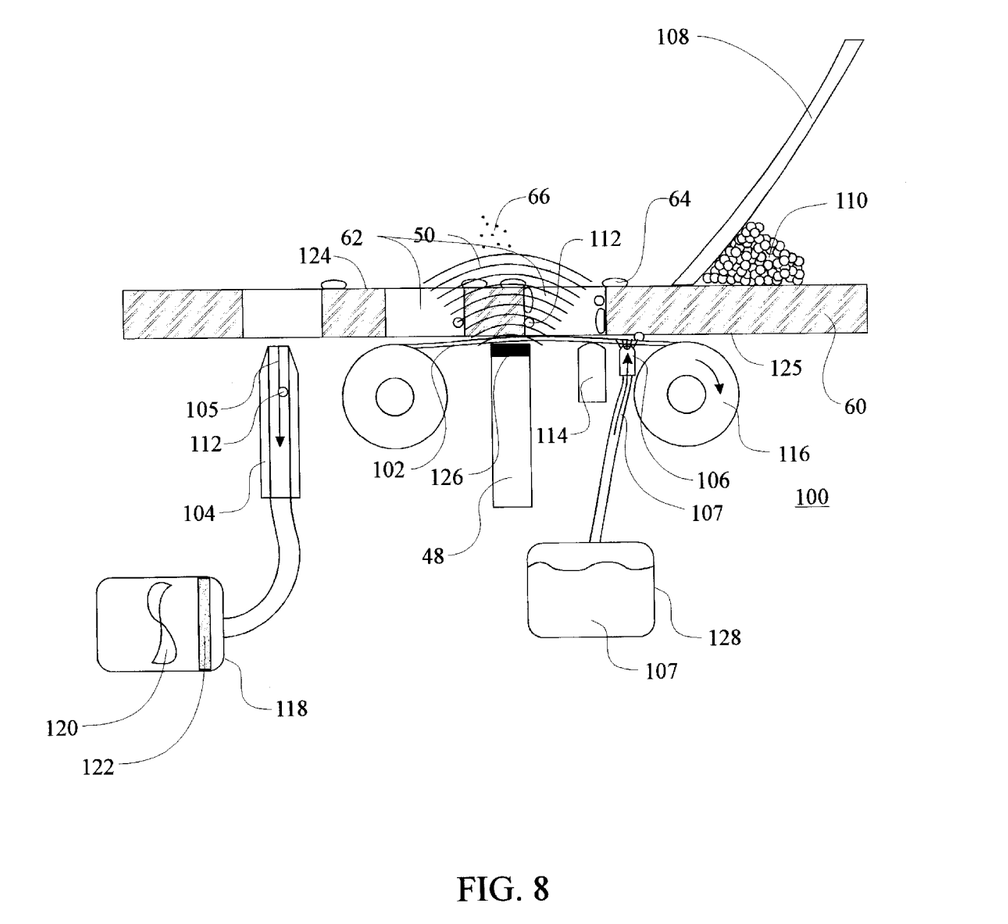
FIG. 8 is a sectional side view of a solder stencil in conjunction with an under wiping system with the use of an ultrasonic transducer for cleaning and drying.

FIG. 8 illustrates a stencil cleaning apparatus 100 similar to FIG. 7 with the additional utility of using vibrational energy 50 in conjunction with fluid 107 applied to the stencil 60 to aid in the cleaning process to further assist in loosening flux and particles 112 from the stencil 60 and apertures 62. Fluid can be retained within the apertures by the wiping paper 102 or other mean, including surface tension. The vibrational energy 50 would further assist in drying the stencil 60 by atomizing 66 residual moisture droplets 64. A vacuum system 104, 118 as described by FIG. 7 can further be included to remove loosened particles 62 and remaining moisture droplets 64. The system can be incorporated within any variation of stencil cleaning system based upon the principles described herein.

Various changes may be made to the embodiment shown herein without departing from the spirit and scope of the present invention.

What is claimed is:

1. A method for cleaning at least one of electronic assembly, stencil, and tooling related to manufacture of electronic assemblies, the steps comprising:

applying a fluid to the at least one of electronic assembly, stencil, and tooling related to manufacture of electronic assemblies, applying vibrational energy by at least one of mechanically coupling a vibrational energy source and the at least one of electronic assembly, stencil, and tooling related to manufacture of electronic assemblies and transferring the vibrational energy through the air directed towards the at least one of electronic assembly, stencil, and tooling related to manufacture of electronic assemblies to aid in at least one of cleaning and drying the at least one of electronic assemblies and tooling related to manufacture of electronic assemblies by atomizing moisture droplets resident to the at least one of electronic assemblies and tooling related to manufacture of electronic assemblies.

2. The method of claim 1, the method further comprising the step of:

applying vibrational energy to aid in both cleaning and drying of at least one of electronic assemblies and tooling related to manufacture of electronic assemblies.

3. The method of claim 2, the method further comprising transferring the relational proximity of the vibrational energy source and the at least one of electronic assembly, stencil, and tooling related to manufacture of electronic assemblies to one another.

4. The method of claim 1, the method further comprising transferring the relational proximity of the vibrational energy source and the at least one of electronic assembly, stencil, and tooling related to manufacture of electronic assemblies to one another.

5. The method of claim 1, the method further comprising:

transferring vibrational energy through air to the at least one of electronic assembly, stencil, and tooling related to manufacture of electronic assemblies to aid in the drying process.

6. A method for cleaning a solder stencil, the method comprising the steps:

applying a fluid for cleaning the solder stencil, and applying vibrational energy by at least one of mechanically coupling a vibrational energy source and the solder stencil and transferring the vibrational energy through the air directed towards the solder stencil to aid in drying the solder stencil.

7. The method of claim 6, the method further comprising the step:

transferring the relational proximity of the vibrational energy source and the solder stencil to one another.

8. The method of claim 7, the method further comprising the step:

applying vibrational energy to the fluid to assist in a cleaning process.

9. The method of claim 6, the method further comprising the step:

applying vibrational energy to the fluid to assist in a cleaning process.

10. The method of claim 9, the method further comprising the steps commonly associated with automated solder screen printing, the commonly associated steps of solder screen printing comprising aligning electronic pads of a printed circuit board and apertures of the solder stencil, passing solder paste across apertures of a stencil, and separating the printed circuit board and the solder stencil.

11. The method of claim 6, the method further comprising the steps commonly associated with automated solder screen printing, the commonly associated steps of solder screen printing comprising aligning electronic pads of a printed circuit board and apertures of the solder stencil, passing solder paste across apertures of a stencil, and separating the printed circuit board and the solder stencil.

12. The method of claim 6, the method further comprising the step:

wiping the stencil with the wiping material.

13. The method of claim 12, method further comprising the step:

applying a vacuum force to aid in cleaning the stencil.

14. The method of claim 6, the method further comprising the step:

applying a vacuum force to aid in cleaning the stencil.

15. A method for cleaning and drying a stencil, the method comprising the steps:

aligning a printed circuit board to the stencil, the stencil comprising at least one aperture, positioning the printed circuit board proximate the stencil;

passing a printable medium across the at least one aperture of the stencil to apply a pattern of printable medium onto the printed circuit board, applying a fluid based cleaning process to at least one of the stencil and a wiping material; and applying vibrational energy by at least one of through the air, via mechanical contact to the stencil, and to the wiping material, to aid in at least one of cleaning and drying the stencil.

16. The method of claim 15, the method further comprising the step:

applying the vibrational energy to aid in both cleaning and drying of the stencil.

17. The method of claim 15, the method further comprising the step:

wiping the stencil with the wiping material.

18. The method of claim 15, the method further comprising the step:

applying a vacuum force to aid in cleaning the stencil.

19. The method of claim 17, the method further comprising the step:

applying a vacuum force to aid in cleaning the stencil.

* * * * *